US010147580B2

(12) United States Patent
Matsumoto

(10) Patent No.: US 10,147,580 B2
(45) Date of Patent: Dec. 4, 2018

(54) MULTI CHARGED PARTICLE BEAM BLANKING APPARATUS, MULTI CHARGED PARTICLE BEAM BLANKING METHOD, AND MULTI CHARGED PARTICLE BEAM WRITING APPARATUS

(71) Applicant: NuFlare Technology, Inc., Yokohama-shi (JP)

(72) Inventor: Hiroshi Matsumoto, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 105 days.

(21) Appl. No.: 15/448,242

(22) Filed: Mar. 2, 2017

(65) Prior Publication Data

US 2017/0271118 A1 Sep. 21, 2017

(30) Foreign Application Priority Data

Mar. 15, 2016 (JP) .................................. 2016-051221

(51) Int. Cl.
*G21K 5/04* (2006.01)
*H01J 1/35* (2006.01)
(Continued)

(52) U.S. Cl.
CPC .......... *H01J 37/045* (2013.01); *H01J 37/063* (2013.01); *H01J 37/24* (2013.01); *H01J 37/3177* (2013.01); *H01J 2237/0435* (2013.01)

(58) Field of Classification Search
CPC .......... H01J 37/02; H01J 37/023; H01J 37/04; H01J 37/045; H01J 2237/04;
(Continued)

(56) References Cited

U.S. PATENT DOCUMENTS

2008/0283767 A1* 11/2008 Platzgummer ......... B82Y 10/00
250/396 R
2009/0121149 A1* 5/2009 Radovanov ............. H01J 37/12
250/396 R
(Continued)

FOREIGN PATENT DOCUMENTS

JP 2005-116743 4/2005
JP 2016-54291 4/2016
(Continued)

OTHER PUBLICATIONS

Combined Office Action and Search Report dated Nov. 28, 2017 in Taiwanese Patent Application No. 106104287 (with English translation) 9 pages.
(Continued)

*Primary Examiner* — Nicole Ippolito
(74) *Attorney, Agent, or Firm* — Oblon, McClelland, Maier & Neustadt, L.L.P.

(57) ABSTRACT

A multi charged particle beam blanking apparatus includes a substrate, where a plurality of passage holes are formed, to let multi-beams of charged particle beams individually pass through a passage hole concerned; a plurality of reference electrodes, each arranged close to a corresponding passage hole, to be applied with a reference potential, not a ground potential, not via a transistor circuit, in an irradiation region of the whole multi-beams; and a plurality of switching electrodes, arranged at the substrate such that each of the plurality of switching electrodes and a corresponding paired one of the plurality of reference electrodes are opposite each other across a corresponding passage hole, to be applied with the reference potential and a control potential different from the reference potential in a switchable manner.

10 Claims, 7 Drawing Sheets

(51) Int. Cl.
*H01J 37/04* (2006.01)
*H01J 37/317* (2006.01)
*H01J 37/24* (2006.01)
*H01J 37/063* (2006.01)

(58) Field of Classification Search
CPC ....... H01J 2237/043; G21K 1/00; G21K 1/04; G21K 1/08; G21K 5/00; G21K 5/04; G21K 5/10
USPC ......... 250/396 R, 397, 492.1, 492.2, 492.21, 250/492.22, 492.23, 492.3
See application file for complete search history.

(56) References Cited

U.S. PATENT DOCUMENTS

| | | | |
|---|---|---|---|
| 2011/0068276 A1 | 3/2011 | Kruit et al. | |
| 2011/0102413 A1* | 5/2011 | Hamer | G09G 3/3233 345/213 |
| 2011/0227081 A1* | 9/2011 | Matsuda | H01L 27/12 257/59 |
| 2012/0015303 A1 | 1/2012 | Hirata et al. | |
| 2013/0240750 A1 | 9/2013 | Touya et al. | |
| 2014/0008534 A1* | 1/2014 | Li | H01J 37/265 250/307 |
| 2015/0064888 A1* | 3/2015 | Yagita | H01J 37/243 438/514 |
| 2015/0371822 A1* | 12/2015 | Amano | H01J 37/244 250/397 |

FOREIGN PATENT DOCUMENTS

| | | |
|---|---|---|
| KR | 10-2013-0106294 A | 9/2013 |
| KR | 10-1443426 B1 | 9/2014 |
| TW | 201133534 A1 | 10/2011 |

OTHER PUBLICATIONS

Korean Office Action dated Apr. 2, 2018 in Patent Application No. 10-2017-0031900 (with English translation), 9 pages.

* cited by examiner

MULTI CHARGED PARTICLE BEAM BLANKING APPARATUS, MULTI CHARGED PARTICLE BEAM BLANKING METHOD, AND MULTI CHARGED PARTICLE BEAM WRITING APPARATUS

CROSS-REFERENCE TO RELATED APPLICATION

This application is based upon and claims the benefit of priority from the prior Japanese Patent Application No. 2016-051221 filed on Mar. 15, 2016 in Japan, the entire contents of which are incorporated herein by reference.

BACKGROUND OF THE INVENTION

Field of the Invention

Embodiments of the present invention relate generally to a multi charged particle beam blanking apparatus, a multi charged particle beam blanking method, and a multi charged particle beam writing apparatus. More specifically, embodiments of the present invention relate to a blanking apparatus and a blanking method using the blanking apparatus in multi-beam writing, for example.

Description of Related Art

The lithography technique that advances miniaturization of semiconductor devices is extremely important as a unique process whereby patterns are formed in semiconductor manufacturing. In recent years, with high integration of LSI, the line width (critical dimension) required tor semiconductor device circuits becomes progressively narrower year by year. The electron beam writing technique, which intrinsically has excellent resolution, is used for writing or "drawing" mask patterns with electron beams on a mask blank.

As a known example of employing the electron beam writing technique, there is a writing apparatus using multi-beams. Since it is possible for multi-beam writing to irradiate multiple beams at a time, the writing throughput can be greatly increased in comparison with single beam writing. For example, a writing apparatus employing the multi-beam technique forms multi-beams by letting portions of an electron beam emitted from an electron gun pass through a corresponding hole of a plurality of holes in a mask, performs blanking control for each beam, reduces each unblocked beam by an optical system so as to reduce a mask image, and deflects the beam by a deflector to irradiate a desired position on a target object or "sample".

In multi-beam writing, the dose of each beam is individually controlled based on an irradiation time. For highly accurately controlling such a dose of each beam, it is necessary to perform high speed blanking control to provide an ON or OFF state of each beam. In a writing apparatus of the multi-beam system, a blanking control circuit for each beam is mounted on the blanking aperture array mechanism where respective blankers for multi-beams are arranged.

Each blanker for the multi-beams is configured by two counter (opposite) electrodes. Specifically, a control electrode is applied with a voltage for blanking control, and the other counter electrode is grounded (earthed). In blanking control, a beam OFF state is generated by deflecting a beam toward the control electrode side based on a combination of a ground potential applied to the grounded counter electrode and a positive potential applied to the control electrode, and by not letting the beam pass through the aperture of the limiting aperture substrate which is arranged on the downstream side of the blanking aperture. For example, when multi-beams are composed of n×n beams, n×n pairs of electrodes and their control circuits are arranged in an array in the blanking apparatus. For example, with respect to a blanking apparatus in which 512×512 pairs of electrodes and their control circuits are arrayed, it is reported that the fraction defective of the structure described above is about 0.04%. As one of defects, there is a case in which the potential of the control electrode is fixed to a ground potential by some malfunction. In such a case, since the potential of the counter electrode is the ground potential, no electric field is generated between both the electrodes, thereby not deflecting beams. Accordingly, the beams are not controlled to be in the OFF state. Then, such uncontrolled beams, being fixed to the ON state, pass through the limiting aperture. Thus, is a problem in that writing defect occurs because such unwanted beams irradiate the target object. Such defects of the structure by the pairs of electrodes and their control circuits may be produced at the stage of fabrication, and may also be produced with a high probability by a failure during use after mounting the structure in the writing apparatus. It is conventionally difficult to check the beam control state before actually placing the structure in the writing apparatus and starting irradiation of each beam of multi-beams. Although defects produced at the stage of fabrication can be detected by inspection after the fabrication, if a defect being fixed to a beam OH state occurs during used in writing processing, the blanking apparatus itself becomes unusable thereafter.

Then, there has been proposed a method for controlling beams to be in an ON state by installing a two-stage blanking apparatus in which the positions of beam passage holes of the two stages are shifted from each other, and re-deflecting, by using the lower stage, a beam which was once deflected by the upper stage (e.g., refer to Japanese Patent Application Laid-open (JP-A) No. 2005-116743). In such a two-stage blanking apparatus, it becomes possible to block beams (beam OFF) because beam deflection cannot be performed when the potential of the control electrode becomes fixed to a ground potential due to short-circuiting or grounding at one of the upper and lower stages. However, in this method, there remains a problem in that since it is necessary to use a two-stage blacking apparatus, accordingly, double control needs to be performed.

BRIEF SUMMARY OF THE INVENTION

According to one aspect of the present invention, a multi charged particle beam blanking apparatus includes a substrate, in which a plurality of passage holes are forced in an array, configured to let portions of multi-beams of charged particle beams individually pass through a passage hole concerned in the plurality of passage holes; a plurality of reference electrodes, each arranged close to a corresponding one of the plurality of passage holes at the substrate, configured to be applied with a reference potential, not a ground potential, not via a transistor circuit, in an irradiation region of a whole of the multi-beams; a plurality of switching electrodes, arranged at the substrate in such a manner that each of the plurality of switching electrodes and a corresponding paired one of the plurality of reference electrodes are opposite each other with respect to the corresponding one of the plurality of passage holes, configured to be applied with the reference potential and a control potential different from the reference potential in a switchable manner; and a plurality of control circuits, each using a transistor circuit, arranged in the substrate and configured to apply the reference potential and the control potential in the switchable manner to a corresponding one of the plurality of switching electrodes.

According to another aspect of the present invention, a multi charged particle beam blanking method includes controlling to be is a beam ON state, while using a blanking apparatus where a plurality of pairs, each composed a reference electrode which is applied with a reference potential, being not a ground potential, not via a transistor circuit. In an irradiation region of a whole of multi-beams of charged particle beams, and a switching electrode which is applied with the reference potential and a control potential, different from the reference potential, in a switchable manner, are arranged in an array at a substrate such that the reference electrode and the switching electrode are opposite each other with respect to a corresponding passage hole through which a corresponding beam of the multi-beams passes, by applying the reference potential, to the switching electrode in order not to deflect the corresponding beam, which passes through the corresponding passage hole, between the switching electrode and the reference electrode; and controlling to be in beam OFF state, while using the blanking apparatus, by applying the control potential to the switching electrode and deflecting the corresponding beam, which passes through the corresponding passage hole, between the switching electrode and the reference electrode.

According to yet another aspect of the present invention, a multi charged particle beam writing apparatus includes a stage configured to mount a target object thereon and to be continuously movable; an emitter configured to emit a charged particle beam; a forming aperture array substrate, in which a plurality of openings are formed, configured to form multi-beams by letting a region including a whole of the plurality of openings be irradiated with the charged particle beam, and letting portions of the charged particle beam individually pass through a corresponding one of the plurality of openings; a blanking apparatus for multi charged particle beams, configured to individually deflect in a blanking manner a corresponding beam of the multi-beams having passed through the plurality of openings of the forming aperture array substrate, wherein the blanking apparatus includes a substrate, in which a plurality of passage holes are formed in an array, configured to let portions of multi-beams of charged particle beams individually pass through a passage hole concerned in the plurality of passage holes, a plurality of reference electrodes, each arranged close to a corresponding one of the plurality of passage, holes at the substrate configured to be applied with a reference potential, not a ground potential, not via a transistor circuit, in an irradiation region of a whole of the multi-beams, a plurality of switching electrodes, arranged at the substrate in such a manner that each of the plurality of switching electrodes and a corresponding paired one of the plurality of reference electrodes are opposite each other with respect to the corresponding one of the plurality of passage holes, configured to be applied with the reference potential and a control potential different from the reference potential in a switchable manner, and a plurality of control circuits, each using a transistor circuit, arranged in the substrate and configured to apply the reference potential and the control potential in the switchable manner to a corresponding one of the plurality of switching electrodes; and a limiting aperture substrate configured to block each beam having been deflected to be in a beam OFF state by the blanking apparatus.

DETAILED DESCRIPTION OF THE INVENTION

First Embodiment

A first embodiment of the present invention below describes a blanking apparatus and a blanking method that can perform control so as not to form, in multi-beams, a defective beam being fixed to a beam ON state and therefore being unable to be blanking-controlled, and describes a writing apparatus employing the blanking apparatus.

In the first embodiment below, there will be described a configuration in which an electron beam is used as an example of a charged particle beam. The charged particle beam is not limited to the electron beam, and other charged particle beam such as an ion beam may also be used.

Figure 1:
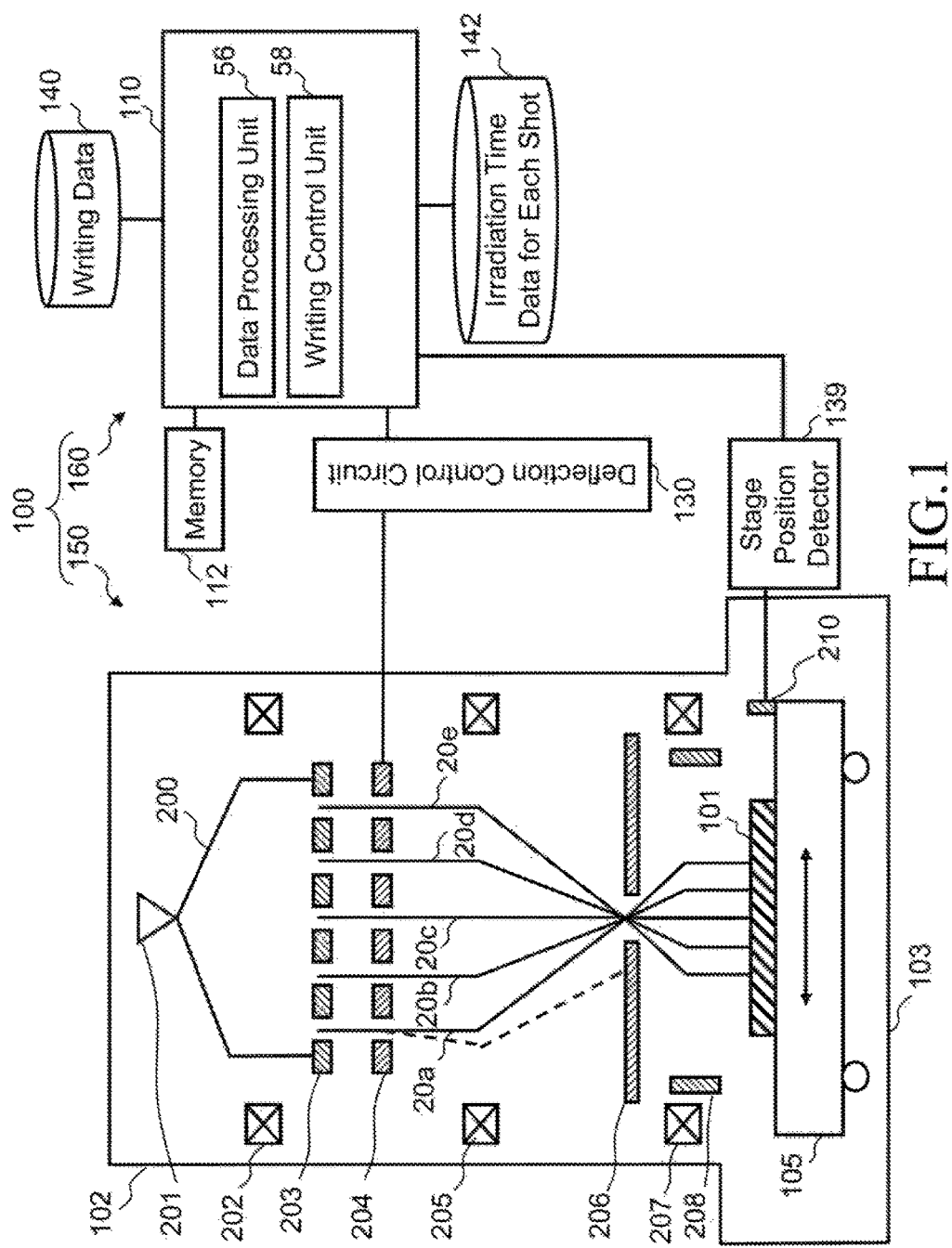
FIG. 1 is a schematic diagram showing a configuration of a writing apparatus according to a first embodiment.

FIG. 1 is a schematic diagram showing a configuration of a writing, or "drawing" apparatus according to the first embodiment. As shown in FIG. 1, a writing apparatus 100 includes a writing unit 150 and a control unit 160. The writing apparatus 100 is an example of a multi charged particle beam writing apparatus. The writing unit 150 includes an electron optical column 102 and a writing chamber 103. In the electron optical column 102, there are arranged an electron gun 201, an illumination lens 202, a forming aperture array substrate 203, a blanking aperture array mechanism 204, a reducing lens 205, a limiting aperture substrate 206, an objective lens 207, and a deflector 208. In the writing chamber 103, there is arranged an XY stage 105. On the XY stage 105, a target object or "sample" 101 such as a mask blank serving as a writing target substrate is placed when writing is performed. The target object 101 is, for example, an exposure mask used for manufacturing semiconductor devices, or a semiconductor substrate (silicon wafer) for manufacturing semiconductor devices. Moreover, a mirror 210 for measuring the position of the XY stage 105 is arranged on the XY stage 105.

The control circuit 160 includes a control computer 110, a memory 112, a deflection control circuit 130, a stage position detector 139, and storage devices 140 and 142 such as magnetic disk drives. The control computer 110, the memory 112, the deflection control circuit 130, the stage position detector 139, and the storage devices 140 and 142 are connected with each other through a bus (not shown). Writing data is input from the outside of the writing apparatus 100 into the storage device 140 (storage unit) and stored therein.

In the control computer 110, there are arranged a data processing unit 56 and a writing control unit 58. Each of "... units" such as the data processing unit 56 and the writing control unit 58 includes a processing circuitry. As the processing circuitry, for example, an electric circuit, computer, processor, circuit board, quantum circuit, semiconductor device, or the like can be used. Each " . . . unit" may use a common processing circuitry (same processing circuitry), or different processing circuitries (separate processing circuitries). Data which is input and output to/from the data processing unit 56 and the writing control unit 58, and data being operated are stored in the memory 112 each time.

FIG. 1 shows configuration elements necessary for describing the first embodiment. It should be understood that other configuration elements generally necessary for the writing apparatus 100 may also be included therein.

Figure 2A:
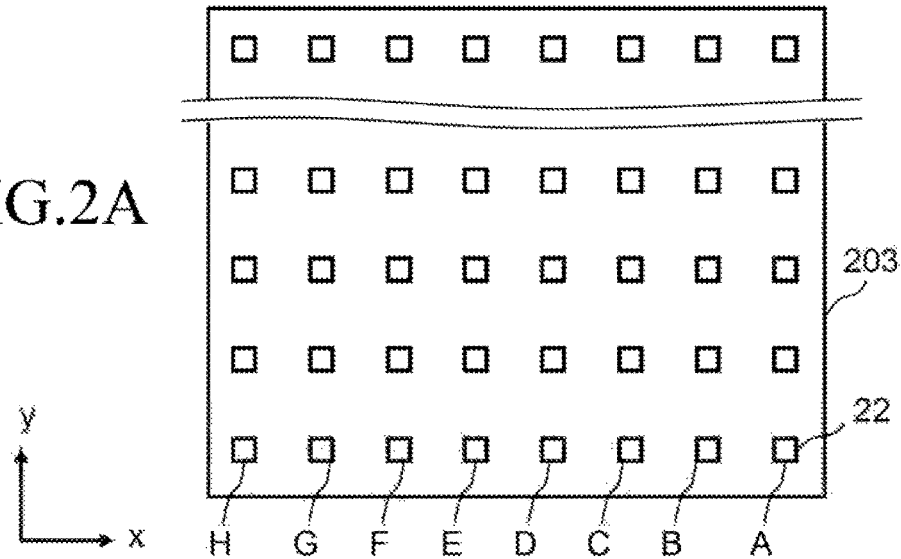
FIGS. 2A and 2B are conceptual diagrams each showing a configuration of a forming aperture array substrate according to the first embodiment.
Figure 2B:
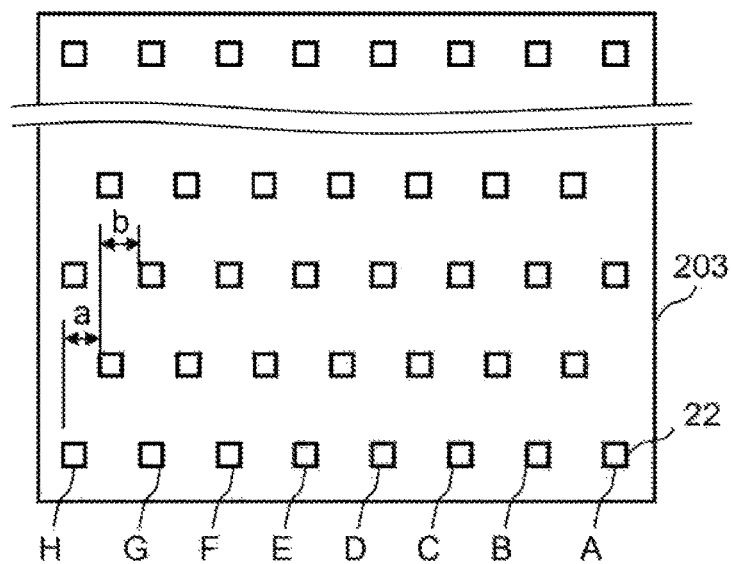

FIGS. 2A and 2B are conceptual diagrams each showing a configuration of a forming aperture array substrate according to the first embodiment. As shown in FIG. 2A, holes (openings) 22 of m rows long (y direction) and n columns wide (x direction) (m≥2, n≥2) are formed, like a matrix, at a predetermined arrangement pitch in the forming aperture array substrate 203. In FIG. 2A, for example, holes 22 of 512 (rows)×8 (columns) are formed. Each of the holes 22 is a quadrangle of the same dimensional shape. Alternatively, each of the holes 22 can be a circle of the same circumference. Here, there is shown an example in which each of the rows arrayed in the y direction has eight holes 22 from A to H in the x direction. Multi-beams 20 are formed by letting portions of an electron beam 200 individually pass through a corresponding one of a plurality of holes 22. The case in which the holes 22 of a plurality of rows and columns are arranged in both the x and the y directions is shown here, but the arrangement is not limited thereto. For example, it is also acceptable that a plurality of holes 22 are arranged in only one row (x direction) or in only one column (y direction). That is, in the case of the only one row, a plurality of holes 22 are arranged as a plurality of columns, and in the case of the only one column, a plurality of holes 22 are arranged as a plurality of rows. The method of arranging the holes 22 is not limited to the case of FIG. 2A where holes are arranged like a grid in the length and width directions. For example, as shown in FIG. 2B, as to the first and second rows arrayed in the length direction (y direction) each hole in the first row and each hole in the second row may be mutually displaced in the width direction (x direction) by a dimension "a". Similarly, as to the second and third rows arrayed in the length direction (y direction), each hole in the second row and each hole in the third row may be mutually displaced in the width direction (x direction) by a dimension "b", for example.

Figure 3:
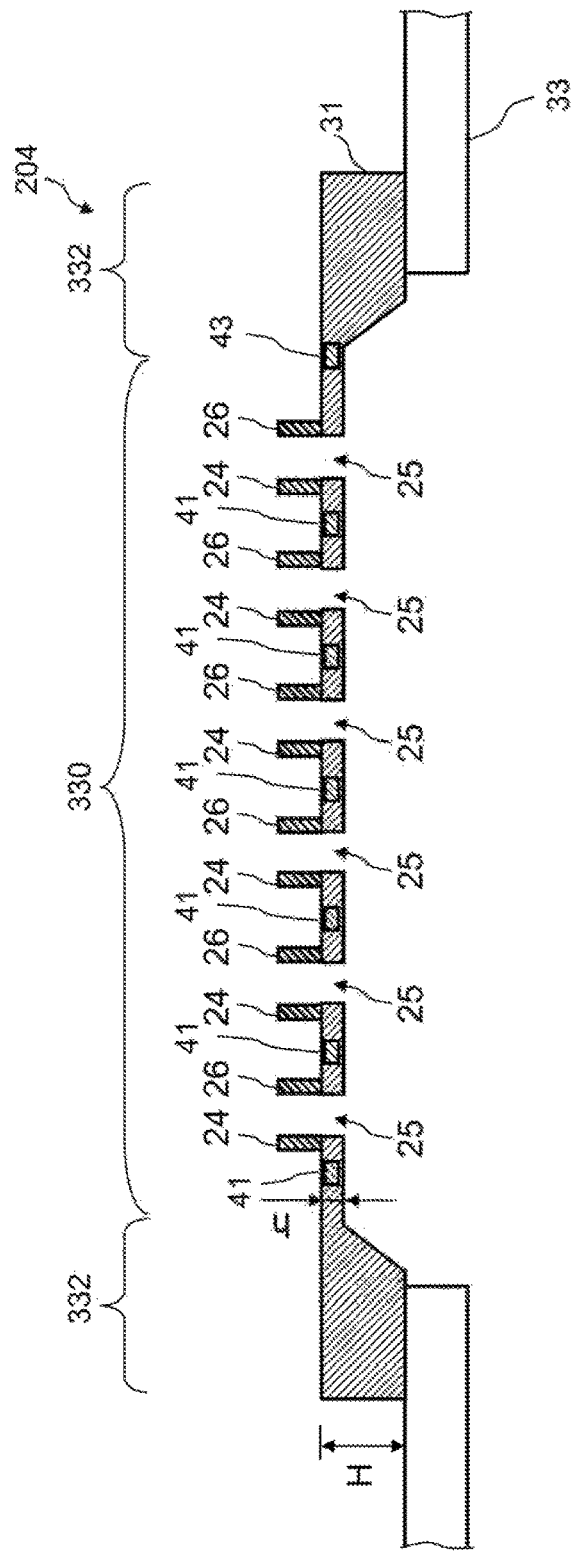
FIG. 3 is a sectional view showing a configuration of a blanking aperture array mechanism according to the first embodiment.
Figure 4:
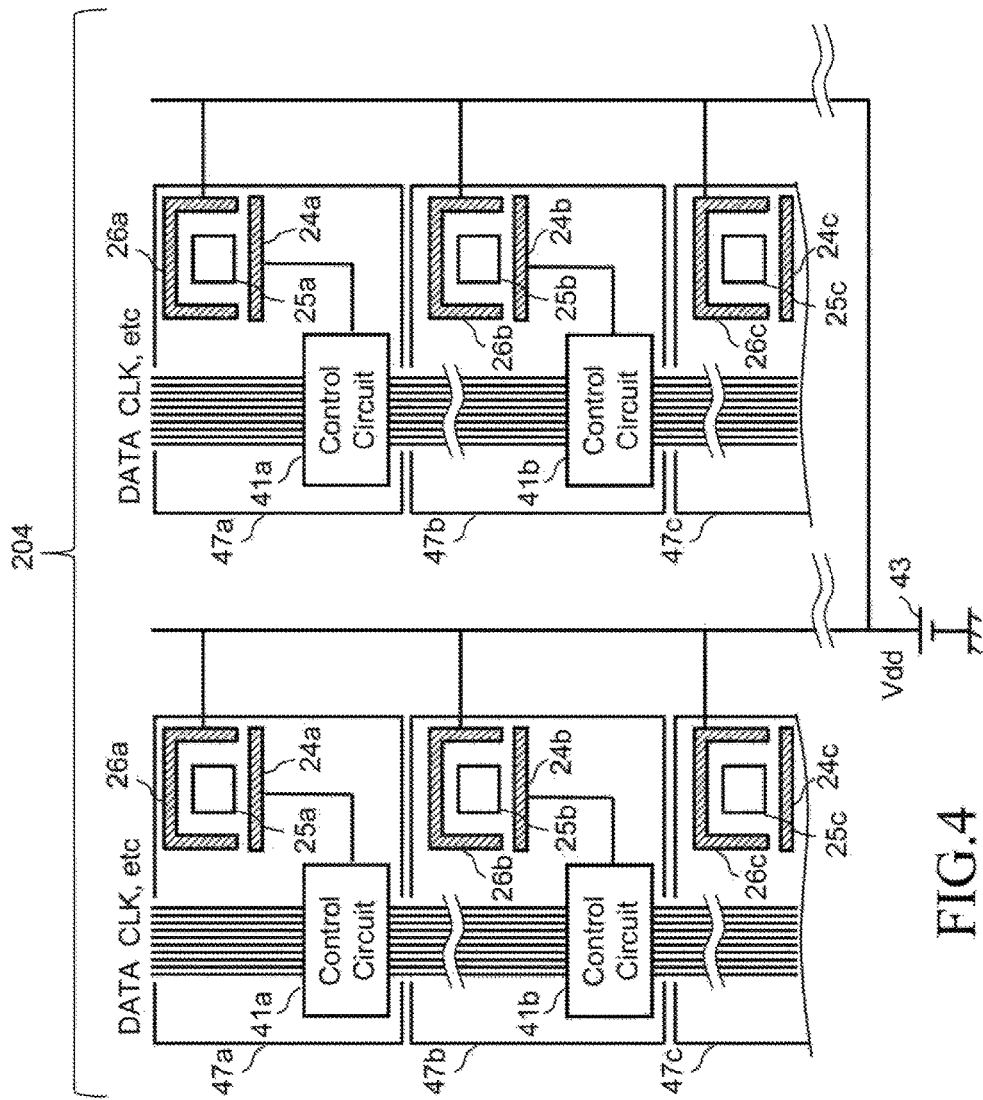
FIG. 4 is a top view conceptual diagram showing a part of the configuration in a membrane region of a blanking aperture array mechanism according to the first embodiment.

FIG. 3 is a sectional view showing the configuration of a blanking aperture array mechanism according to the first embodiment. FIG. 4 is a top view conceptual diagram showing a part of the configuration in a membrane region of a blanking aperture array mechanism according to the first embodiment. Between FIGS. 3 and 4, the positional relation among a switching electrode 24, a reference electrode 26, and the control circuit 41 is not in accordance with each other. With regard to the configuration of the blanking aperture array mechanism 204, as shown in FIG. 3, a semiconductor substrate 31 made of silicon, etc. is placed on a support table 33. The central part of the substrate 31 is shaved from the back side and processed to be a membrane region 330 (first region) having a thin film thickness h. The circumference surrounding the membrane region 330 is a circumference region 332 (second region) having a thick film thickness H. The upper surface of the membrane region 330 and the upper surface of the circumference region 332 are formed to be at the same height position, or substantially at the same height position. At the backside of the circumference region 332, the substrate 31 is supported to be on the support table 33. The central part of the support table 33 is open, and the position of the membrane region 330 is located in the opening part of the support table 33.

In the membrane region 330, there are formed passage holes 25 (openings), through which multi-beams individually pass, at the positions corresponding to the holes 22 of the forming aperture array substrate 203 shown in FIG. 2A or 2B. In other words, in the substrate 31, there are formed a plurality of passage holes 25 through each of which a corresponding electron beam of multi-beams passes. Moreover, in the membrane region 330, as shown in FIGS. 3 and 4, a plurality of pairs (blanker: blanking deflector) each composed of the switching electrode 24 (24a, 24b, or 14c) and the reference electrode 26 (26a, 26b, or 26c) are arranged close to each corresponding passage hole 25 in a manner such that the electrodes 24 and 26 are opposite each other across the passage hole 25 concerned. Moreover, close to each passage hole 25 and in the membrane region 330 in the direction of the film thickness, there is arranged a control circuit 41 (logic circuit) which switchably applies a binary deflection voltage to the switching electrode 24 for each passage hole 25. The reference electrode 26 for each beam is applied with a positive electric potential Vdd from the power source 43.

Although, in FIGS. 3 and 4, the number of the switching electrodes 24 is the same as the number of the reference electrodes 26, it is not limited thereto. It is also preferable to arrange a common reference electrode 26 which is common to a plurality of switching electrodes 24 arrayed in the same row or column. Therefore, the composition ratio between a plurality of reference electrodes 26 and a plurality of switching electrodes 24 may be one-to-one or one-to-many.

Moreover, as shown in FIG. 4, for example, 10-bit parallel lines for control signals are connected to each control circuit 41. In addition to the 10-bit parallel lines for controlling, for example, clock signal lines and wiring lines for a power source are connected to each control circuit 41. A part of the parallel lines may be used as the clock signal lines and the power source wiring lines. An individual blanking mechanism 47 composed of the switching electrode 24, the reference electrode 26, and the control circuit 41 is configured for each beam of the multi-beams. In the example of FIG. 3, the switching electrode 24, the reference electrode 26, and the control circuit 41 are arranged in the membrane region 330 having a thin film thickness of the substrate 31.

The electron beam 20 passing through a corresponding passage hole 25 is deflected by a difference between potentials which are independently applied to the two paired electrodes 24 and 26. Blanking control is performed by this deflection. In other words, each pair of the switching electrode 24 and the reference electrode 26 deflects in a blanking manner a corresponding beam of multi-beams each having passed through a corresponding one of a plurality of holes 22 (openings) of the forming aperture array substrate 103.

Figure 5:
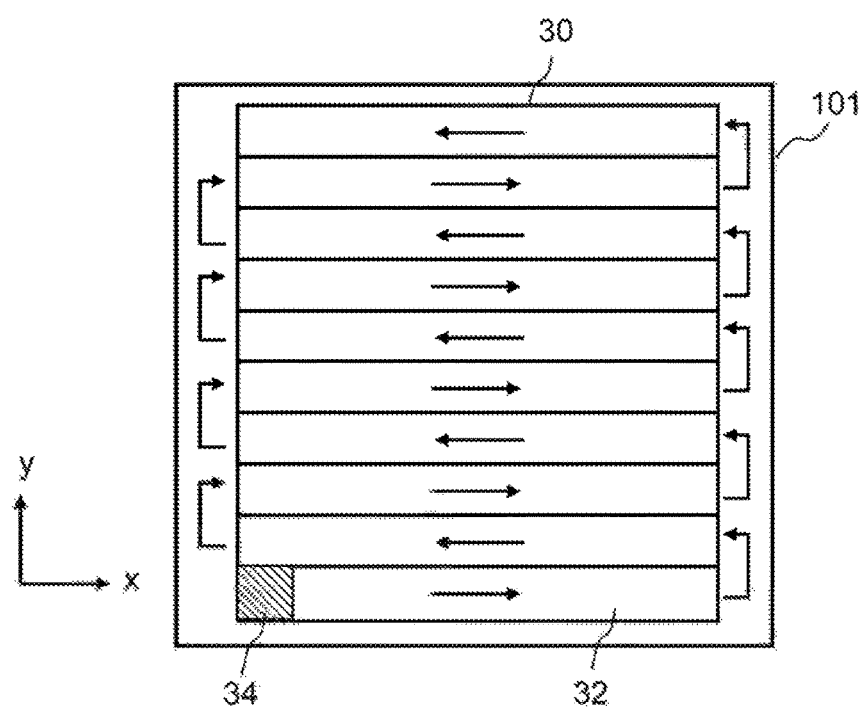
FIG. 5 is a conceptual diagram illustrating an example of a writing operation according to the first embodiment.

FIG. 5 is a conceptual diagram illustrating an example of a writing operation according to the first embodiment. As shown in FIG. 5, a writing region 30 of the target object 101 is virtually divided by a predetermined width or "height" (to be a stripe width) in the y direction into a plurality of strip-shaped stripe regions, for example. Each of the stripe regions 31 serves as a unit region for writing. The XY stage 105 is moved and adjusted such that an irradiation region 34 which can be irradiated by one irradiation of the multi-beams 20 is located at the left end of the first stripe region 32 or at a position more left than the left end, and then writing is started. When writing the first stripe region 32, the writing advances relatively in the x direction by moving the XY stage 105 in the −x direction, for example. The XY stage 105 is continuously moved at a predetermined speed, for example. After writing the first stripe region 32, the stage position is moved in the −y direction to make an adjustment such that the irradiation region 34 is located at the right end of the second stripe region 32 or at a position more right than the right end to be relatively located in the y direction. Then, similarly, writing advances in the −x direction, by moving the XY stage 105 in the x direction, for example. That is, writing is performed while alternately changing the direction, such as performing writing in the x direction in the third stripe region 32, and in the −x direction in the fourth stripe region 32, and thus, the writing time can be reduced. However, when writing each stripe region 32, the writing operation is not limited to the case of performing writing while alternately changing the direction, and it is also acceptable to perform writing in the same direction. By one shot of multi-beams which have been formed by passing through respective corresponding holes 22 of the forming aperture array substrate 203, a plurality of shot patterns of the same number as the number of the holes 22 are formed at a time.

Writing processing is performed as described below. Specifically, the data processing unit 56 reads writing data from the storage device 140, and calculates the area density of a pattern arranged in each of a plurality of mesh regions obtained by virtually dividing the writing region of the target object 101 or a chip region to be written into meshes. For example, first, the writing region of the target object 101, or a chip region to be written is divided by a predetermined width or "height" (to be a stripe width) into a plurality of strip-shaped stripe regions. Then, each stripe region is virtually divided into a plurality of mesh regions described above. It is preferable that the size of the mesh region is, for example, a beam size, or smaller than the beam size. For example, the size of the mesh region is preferably about 10 nm. The data processing unit 56 reads, for each stripe region, corresponding writing data from the storage device 140, for example, and assigns a plurality of figure patterns defined in the writing data to mesh regions. Then, the area density of a figure pattern arranged in each mesh region is calculated.

Moreover, the data processing unit 56 calculates, for each predetermined sized mesh region, an irradiation time T (which hereinafter will also be called a shot time or an exposure time) of an electron beam per shot. When performing multiple writing, an irradiation time T of an electron beam per shot in each hierarchy (or "each writing process") of the multiple writing should be calculated. It is preferable to obtain an irradiation time T, which serves as a reference, to be in proportion to a calculated pattern area density. Moreover, it is preferable that an irradiation time T to be finally calculated is a time equivalent to a dose after correction, that is a dose having been corrected with respect to a dimension change amount due to a phenomenon causing dimension variations, such as a proximity effect, a fogging effect, a loading effect, etc. (not shown). The size of a plurality of mesh regions to define the irradiation time T, and the size of a plurality of mesh regions to define the pattern area density may be the same size or different sizes. When they are different sizes, each irradiation time T may be calculated after interpolating an area density by linear interpolation, etc. The irradiation time T for each mesh region is defined in an irradiation time map, and the irradiation time map is stored in the storage device 142, for example.

Moreover, the data processing unit 56 converts data of irradiation time of a corresponding beam into 10-bit data, and generates irradiation time array data. The generated irradiation time array data is output to the deflection control circuit 130.

The deflection control circuit 130 outputs, for each shot, irradiation time array data to each control circuit 41.

In a writing step, under the control of the writing control unit 58, the writing mechanism 150 performs writing, for each beam shot, based on the irradiation time concerned. Specifically, it operates as described below.

The electron beam 200 emitted from the electron gun 201 (emitter), almost perpendicularly (vertically) illuminates the whole of the forming aperture array substrate 203 by the illumination lens 202. In the forming aperture array substrate 203, a plurality of quadrangular (rectangular) holes is irradiated by the electron beam 200. For example, a plurality of quadrangular electron beams (multi-beams) 20a to 20e are formed by letting portions of the electron beam 200, which irradiate the positions of a plurality of holes, individually pass through a corresponding one of the plurality of holes of the forming aperture array substrate 203. The multi-beams 20a to 20e individually pass through corresponding blankers (first deflector: individual blanking mechanism) of the blanking aperture array mechanism 204. Each blanker deflects (provides blanking deflection) the electron beam 20 which is individually passing.

The multi-beams 20a to 20e having passed through the blanking aperture array mechanism 204 are reduced by the reducing lens 205, and go toward the hole in the center of the limiting aperture substrate 206. At this stage, the electron beam 20 which was deflected by the blanker of the blanking aperture array mechanism 204 deviates from the hole in the center of the limiting aperture substrate 206 and is blocked by the limiting aperture substrate 206. On the other hand, the electron beam 20 which was not deflected by the blanker of the blanking aperture array mechanism 204 passes through the hole in the center of the limiting aperture substrate 206 as shown in FIG. 1. Blanking control is provided by ON/OFF of the individual blanking mechanism 47 so as to control ON/OFF of beams. Thus, the limiting aperture substrate 206 blocks each beam which was deflected to be in the OFF state by the individual blanking mechanism 47. Then, one shot beam is formed by a beam which has been made during a period from becoming beam ON to becoming beam OFF and has passed through the limiting aperture substrate 206. The multi-beams 20 having passed through the limiting aperture substrate 206 are focused by the objective lens 207 so as to be a pattern image of a desired reduction ratio. The respective beams (the whole of the multi-beams 20) having passed through the limiting aperture substrate 206 are collectively deflected in the same direction by the deflector 208 in order to irradiate respective beam irradiation positions on the target object 101. While the XY stage 105 continuously moves, controlling is performed by the deflector 205 so that the irradiation positions of the beams may follow the movement of the XY stage 105, for example. The position of the XY stage 105 is measured by way of radiating a laser from the stage position detector 139 to the mirror 210 on the XY stage 105 in order to use its catoptric light for measurement. Ideally, the multi-beams 20 irradiating at a time are aligned at pitches obtained by multiplying the arrangement pitch of a plurality of holes of the forming aperture array substrate 203 by a desired reduction ratio described above. The writing apparatus 100 performs a writing operation by the method of sequentially irradiating a plurality of shot beams being equivalent to an ON beam and being shot at a time. When a desired pattern is written, beams necessary according to the pattern is controlled to be ON by blanking control.

Figure 6:
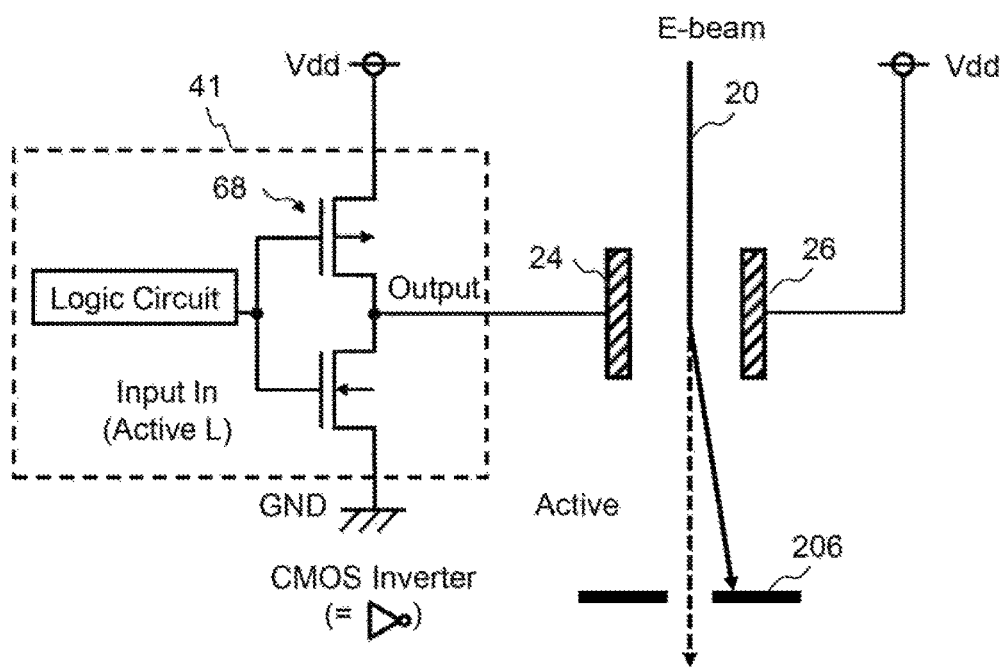
FIG. 6 shows an example of an individual blanking mechanism according to the first embodiment.

FIG. 6 shows an example of an individual blanking mechanism according to the first embodiment. As shown in FIG. 6, there is arranged a CMOS (Complementary Metal Oxide Semiconductor) inverter circuit 68 in the control circuit 41. The CMOS inverter circuit 68 is connected to a positive electric potential (Vdd: first potential) (e.g., 5 V) (reference potential) and a ground electric potential) (GND: second potential) (an example of a control potential different from a reference potential). The output line (OUT) of the CMOS inverter circuit 68 is connected to the switching electrode 24. On the other hand, the reference electrode 26 is applied with a positive electric potential (Vdd: first potential) (e.g., 5 V) from the power source 43 not via a transistor circuit, such as the CMOS inverter circuit 68, in a region where an X-ray resulting from the multi-beams 20 to be described later is emitted in the membrane region 330. In other words, a plurality of reference electrodes 26 each of which is applied with a positive potential (Vdd) (reference potential), not a ground potential, not via a transistor circuit, at least in the irradiation region (also an array arrangement region) of the whole multi-beams are arranged close to respective corresponding passage holes 25 on the substrate 31. A plurality of switching electrodes 24, each or which is applied with a reference potential and a ground potential in a switchable manner, are arranged on the substrate 31 such that the switching electrode 24 and the reference electrode 26 are opposite each other across a corresponding one of a plurality of passage holes 25.

As an input (IN) of the CMOS inverter circuit 68, either an L (low) electric potential (e.g., ground potential) lower than a threshold voltage, or an H (high) electric potential (e.g., 1.5 V) higher than or equal to the threshold voltage is applied as a control signal. According to the first embodiment, in the state (active state) where an L electric potential is applied to the input (IN) of the CMOS inverter circuit 68, the output (OUT) of the CMOS inverter circuit 68 becomes a positive potential (Vdd), and therefore, since there is no potential difference from the positive potential (Vdd) of the reference electrode 26, a corresponding beam 20 is not deflected, thereby controlling to make beams ON by letting the beams pass through the limiting aperture substrate 206. On the other hand, in the state where an H electric potential is applied to the input (IN) of the CMOS inverter circuit 68, the output (OUT) of the CMOS inverted circuit 68 becomes a ground potential, and a corresponding beam 20 is deflected by an electric field due to a potential difference from the positive potential (Vdd) of the reference electrode 26, thereby controlling to make beams OFF by performing blocking using the limiting aperture substrate 206. Thus, the control circuit 41 (first potential applying unit) switchably/selectively applies to the switching electrode 24 (first electrode) two different potentials (Vdd, and ground potential) for blanking control in order to switch a corresponding one of the multi-beams between a beam ON state and a beam OFF state. Thus, each of a plurality of control circuits each using a transistor circuit, is arranged in the substrate 31, and applies a reference potential and a ground potential in a switchable manner to a corresponding one of a plurality of switching electrodes 24.

A reference potential applied to each of a plurality of switching electrodes 24, and a reference potential applied to each of a plurality of reference electrodes 26 are supplied from the same power source. Specifically, the positive potential (Vdd) connected to the CMOS inverter circuit 68, and the positive potential (Vdd) connected to the reference electrode 26 are supplied from the same power source 43. Thereby, when controlling to be beam ON, change in the difference between potentials of the switching electrode 24 and the reference electrode 26 can be reduced. Therefore, since a stable electric potential difference can be maintained, it is possible to suppress deflection deviation of the ON beam 20.

According to the first embodiment, using a blanking aperture array mechanism 204 (blanking apparatus) where a plurality of pairs each composed the reference electrode 26 which is applied with a reference potential, being not a ground potential, not via a transistor circuit, and the switching electrode 24 which is applied with a reference potential and a ground potential in a switchable manner are arranged in an array on the substrate 31 such that the switching electrode 24 and the reference electrode 26 are opposite each other across a corresponding passage hole 25 through which a corresponding one of the electron multi-beams 20 passes, it is controlled to be in a beam ON state by applying a reference potential to the switching electrode 24 and not deflecting a corresponding beam 20, which passes through a corresponding passage hole 25, between the switching electrode 24 and the reference electrode 26.

On the other hand, using the blanking aperture array mechanism 204, it is controlled to be in a beam OFF state by applying a ground potential to the switching electrode 24 and deflecting a corresponding beam 20, which passes through a corresponding passage hole 25, between the switching electrode 24 and the reference electrode 26. Blanking control of the multi-beams 20 is provided by suitably executing the above two steps.

When continuing to irradiate a transistor circuit with an X-ray, the amplitude at the output side of the transistor tends to be small and, by and by, be 0 V (GND potential). In the writing apparatus 100, since the forming aperture array substrate 203 is arranged near the upper part of the blanking aperture array mechanism 204, when forming the multi-beams 20, the rest of the electron beam 200 is blocked by the forming aperture array substrate 203. On this occasion, an X-ray is emitted due to collision of the electron beam 200. If the control circuit 41 of the blanking aperture array mechanism 204 is continuously irradiated with the X-ray, the amplitude at the output side of the CMOS inverter circuit 68 configured by a transistor circuit may be gradually reduced and, by and by, be 0 V (GND potential). Therefore, the CMOS inverter circuit 68 may easily occur where the output is fixed to the GND potential due to use of the writing apparatus 100, in a large number of the control circuits 41 of the blanking mechanism 47 corresponding to the number of beams of multi-beams. As a result, some switching electrodes 24 may be fixed to the GND potential. Since the reference electrode 26 (counter electrode) is conventionally the GND potential, if the switching electrode 24 is fixed to the GND potential, it becomes impossible to deflect a passing beam, thereby becoming a defective beam, such as an "always-ON" beam. Then, according to the first embodiment, the reference electrode 26 (counter electrode) is made to be not the GND potential but the other potential (in this case, a positive electric potent in (Vdd)) connected to the CMOS inverter circuit 68. Moreover, the reference electrode 26 is applied with a reference potential, not via a transistor circuit, at least in the irradiation region (also an array arrangement region) of the whole multi-beams. Therefore, in the region where an X-ray resulting from the multi-beams 20 is emitted in the membrane region 330, a transistor circuit does not exist in the circuit to the reference electrode 26.

Therefore, it is possible to continuously apply a positive potential (Vdd) to the reference electrode 26. Thereby, even if the switching electrode 24 is fixed to the GND potential, since an electric potential difference from the positive potential (Vdd) connected to the reference electrode 26 can be continuously generated, it becomes possible to provide beam deflection. Accordingly, defective beams, such as an "always-ON" beam, caused by that the switching electrode 24 is fixed to the GND potential can be eliminated.

Figure 7:
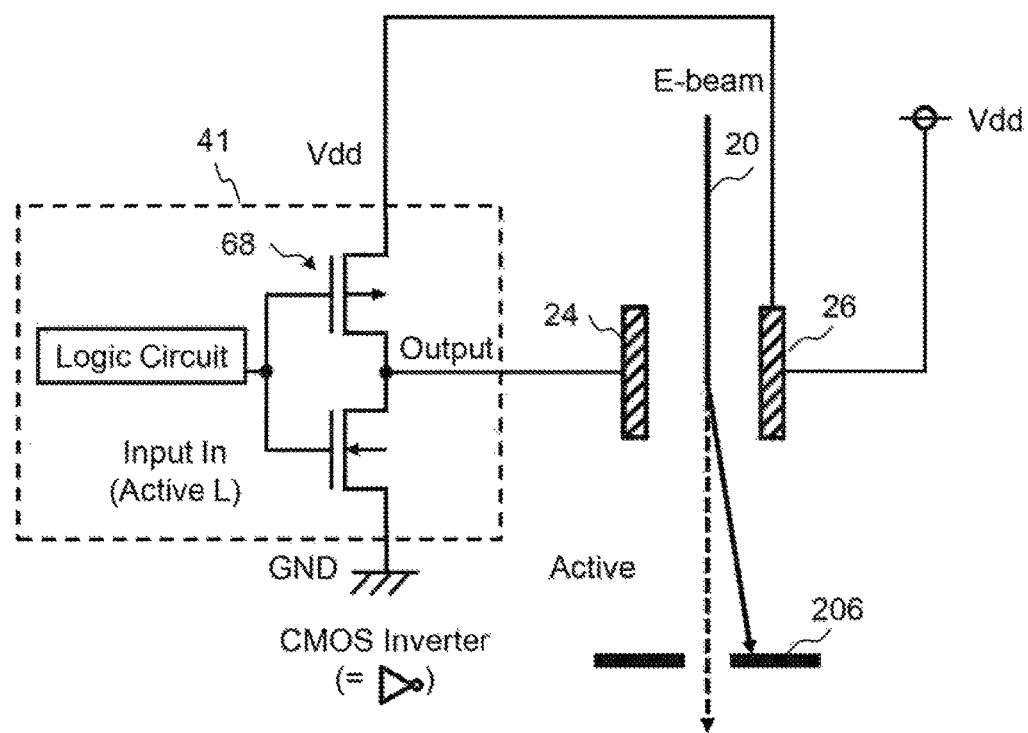
FIG. 7 shows another example of the individual blanking mechanism according to the first embodiment.

FIG. 1 shows another example of the individual blanking mechanism according to the first embodiment. In FIG. 7, a positive electric potential (Vdd) (reference potential) applied to each of a plurality of switching electrodes 24 is supplied from a corresponding paired one of a plurality of reference electrodes 26. The other configuration is the same as that of FIG. 6. By supplying a positive potential (Vdd) from a corresponding paired reference electrode 26, it becomes possible to reduce or eliminate the change in the electric potential difference between the paired switching electrode 24 and reference electrode 26 (that is, it is possible to maintain the same potentials) even if a voltage fluctuation occurs in the power source 43 or the wiring at the upstream side. By this, no passing beams are deflected, thereby performing beam irradiation onto highly precise positions. Moreover, since connected to a paired reference electrode 26 located close, the wiring distance can be shortened and the wiring can be formed at the level where a voltage drop can be substantially ignored.

As described above, according to the first embodiment, it is possible to perform control not to form, in multi-beams, a defective beam being "always-ON" for which blanking control cannot be performed. Therefore, writing can be performed highly accurately without need of exchanging the blanking apparatus.

Embodiments have been explained referring to concrete examples described above. However, the present invention is not limited to these specific examples. While the case of inputting a 10-bit control signal into each control circuit 41 has been described above, the number of bits may be suitably set. For example, a 2-bit (or 3 to 9 bit) control signal may be used. Alternatively, a control signal of 11 bits or more may be used. Moreover, the reference potential is not limited to a positive electric potential. It is acceptable to be a negative potential. Moreover, although the control potential for beam deflection is desirably a GND potential, it is not limited thereto. It may be an electric potential different from a reference potential. What is necessary is to have a sufficient electric potential difference from the reference potential, for providing blanking deflection. Voltage other than 0 V may also be used as ground of LSI. The inverter circuit may be configured setting the ground to a control potential of other than 0 V. In this case, even when, due to some malfunction, the potential of the control electrode is fixed to a ground potential, since the potential of the control electrode is fixed to a control potential, beams are constantly maintained to be OFF. Therefore, similarly to the first embodiment, it is possible to prevent the writing from becoming defective due to that the target object is irradiated with an unnecessary beam.

While the apparatus configuration, control method, and the like not directly necessary for explaining the present invention are not described, some or all of them can be selectively used case-by-case basis. For example, although description of the configuration of the control unit for controlling the writing apparatus 100 is omitted, it should be understood that some or all of the configuration of the control unit can be selected and used appropriately when necessary.

In addition, any other multi charged particle beam blanking apparatus, multi charged particle beam blanking method, and multi charged particle beam writing apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam blanking apparatus comprising:
    a substrate, in which a plurality of passage holes are formed in an array, configured to let portions of multi-beams of charged particle beams individually pass through a passage hole concerned in the plurality of passage holes;
    a plurality of reference electrodes, each arranged close to a corresponding one of the plurality of passage holes at the substrate, configured to be applied with a reference potential, not a ground potential, not via a transistor circuit, in an irradiation region of a whole of the multi-beams;
    a plurality of switching electrodes, arranged at the substrate in such a manner that each of the plurality of switching electrodes and a corresponding paired one of the plurality of reference electrodes are opposite each other with respect to the corresponding one of the plurality of passage holes, configured to be applied with the reference potential and a control potential different from the reference potential in a switchable manner; and
    a plurality of control circuits, each using a transistor circuit, arranged in the substrate and configured to apply the reference potential and the control potential in the switchable manner to a corresponding one of the plurality of switching electrodes.

2. The apparatus according to claim 1, wherein the reference potential applied to the each of the plurality of switching electrodes, and the reference potential applied to each of the plurality of reference electrodes are supplied from a same power source.

3. The apparatus according to claim 1, wherein the reference potential applied to the each of the plurality of switching electrodes is supplied from the corresponding paired one of the plurality or reference electrodes.

4. The apparatus according to claim 1, wherein, as the transistor circuit, a complementary metal oxide semiconductor (CMOS) inverter circuit is used.

5. The apparatus according to claim 4, wherein the CMOS inverter circuit and the reference electrode are conducted with each other.

6. A multi charged particle beam blanking method comprising:
    controlling to be in a beam ON state, while using a blanking apparatus where a plurality of pairs, each composed a reference electrode which is applied with a reference potential, being not a ground potential, not via a transistor circuit, in an irradiation region of a whole of multi-beams of charged particle beams, and a switching electrode which is applied with the reference potential and a control potential different from the reference potential in a switchable manner, are arranged in an array at a substrate such that the reference electrode and the switching electrode are opposite each other with respect to a corresponding passage hole through which a corresponding beam of the multi-beams passes, by applying the reference potential to the switching electrode in order not to deflect the corresponding beam, which passes through the corresponding passage hole, between the switching electrode and the reference electrode; and controlling to be in a beam OFF state, while using the blanking apparatus, by applying the control potential to the switching electrode, and deflecting the corresponding beam, which passes through the corresponding passage hole, between the switching electrode and the reference electrode.

7. A multi charged particle beam writing apparatus comprising:

a stage configured to mount a target object thereon and to be continuously movable;

at emitter configured to emit a charged particle beam;

a forming aperture array substrate, in which a plurality of openings are formed, configured to form multi-beams by letting a region including a whole of the plurality of openings be irradiated with the charged particle beam, and letting portions of the charged particle beam individually pass through a corresponding one of the plurality of openings;

a blanking apparatus for multi charged particle beams, configured to individually deflect in a blanking manner a corresponding beam of the multi-beams having passed through the plurality of openings of the forming aperture array substrate, wherein the blanking apparatus includes:

a substrate, in which a plurality of passage holes are formed in an array, configured to let portions of multi-beams of charged particle beams individually pass through a passage hole concerned in the plurality of passage holes, a plurality of reference electrodes, each arranged close to a corresponding one of the plurality of passage holes at the substrate, configured to be applied with a reference potential, not a ground potential, not via a transistor circuit, in an irradiation region of a whole of the multi-beams, a plurality of switching electrodes, arranged at the substrate in such a manner that each of the plurality of switching electrodes and a corresponding paired one of the plurality of reference electrodes are opposite each other with respect to the corresponding one of the plurality of passage holes, configured to be applied with the reference potential and a control potential different from the reference potential in a switchable manner, and a plurality of control circuits, each using a transistor circuit, arranged in the substrate and configured to apply the reference potential and the control potential in the switchable manner to a corresponding one of the plurality of switching electrodes; and a limiting aperture substrate configured to block each beam having been deflected to be in a beam OFF state by the blanking apparatus.

8. The apparatus according to claim 7, wherein, in the plurality of switching electrodes, a switching electrode corresponding to a beam in an ON state is applied with the reference potential.

9. The apparatus according to claim 7, wherein, in the plurality of switching electrodes, a switching electrode corresponding to a beam in an OFF state is applied with the ground potential.

10. The apparatus according to claim 7, wherein the multi-beams are blanking-controlled by a single-stage deflection by the blanking apparatus.

* * * * *